(12) United States Patent
Choi et al.

(10) Patent No.: US 7,092,447 B2
(45) Date of Patent: Aug. 15, 2006

(54) COMMUNICATION SYSTEM IN DIGITAL TELEVISION

(75) Inventors: In Hwan Choi, Seoul (KR); Young Mo Gu, Seoul (KR); Kyung Won Kang, Seoul (KR); Kook Yeon Kwak, Kyonggi-do (KR)

(73) Assignee: LG Electronics Inc., Seoul (KR)

( * ) Notice: Subject to any disclaimer, the term of this patent is extended or adjusted under 35 U.S.C. 154(b) by 521 days.

(21) Appl. No.: 10/122,269

(22) Filed: Apr. 12, 2002

(65) Prior Publication Data

US 2002/0181599 A1    Dec. 5, 2002

(30) Foreign Application Priority Data

Apr. 25, 2001    (KR) ................................ 2001-22201

(51) Int. Cl.
*H04N 7/18*    (2006.01)
(52) U.S. Cl. ............................. 375/240.25; 375/240.26
(58) Field of Classification Search ........................ 375/240.25–240.29; 348/560–569
See application file for complete search history.

(56) References Cited

U.S. PATENT DOCUMENTS

| | | | |
|---|---|---|---|
| 5,087,975 A | 2/1992 | Citta et al. | |
| 5,233,630 A | 8/1993 | Wolf | |
| 5,488,691 A | 1/1996 | Fuoco et al. | |
| 5,555,024 A | 9/1996 | Limberg et al. | |
| 5,563,884 A | 10/1996 | Fimoff et al. | |
| 5,583,889 A | 12/1996 | Citta et al. | |
| 5,600,677 A | 2/1997 | Citta et al. | |
| 5,602,595 A | 2/1997 | Citta et al. | |
| 5,629,958 A | 5/1997 | Wilming | |
| 5,636,251 A | 6/1997 | Citta et al. | |
| 5,636,252 A | 6/1997 | Patel et al. | |
| 5,706,312 A | 1/1998 | Wei | |
| 5,831,690 A | 11/1998 | Lyons et al. | |
| 5,923,711 A | 7/1999 | Wilming | |
| 5,946,047 A * | 8/1999 | Levan ......................... 348/473 |
| 6,075,569 A | 6/2000 | Lee et al. | |
| 6,208,643 B1 | 3/2001 | Dieterich et al. | |
| 6,490,002 B1 * | 12/2002 | Shintani ..................... 348/569 |
| 6,519,298 B1 | 2/2003 | Kim | |

(Continued)

FOREIGN PATENT DOCUMENTS

KG    2000-0028757    5/2000

(Continued)

OTHER PUBLICATIONS

U.S. Appl. No. 60/198,014, filed Apr. 2000, Brell et al.

(Continued)

*Primary Examiner*—Andy Rao
(74) *Attorney, Agent, or Firm*—Lee, Hong, Degerman, Kang & Schmadeka, P.C.

(57) ABSTRACT

A VSB communication system or transmitter for processing supplemental data packets with MPEG-II data packets includes a VSB supplemental data processor and a VSB transmission system. The VSB supplemental data processor includes a Reed-Solomon coder for coding the supplemental data to be transmitted, a null sequence inserter for inserting a null sequence to an interleaved supplemental data for generating a predefined sequence, a header inserter for inserting an MPEG header to the supplemental data having the null sequence inserted therein, a multiplexer for multiplexing an MPEG data coded with the supplemental data having the MPEG header added thereto in a preset multiplexing ratio and units. The output of the multiplexer is provided to an 8T-VSB transmission system for modulating a data field from the multiplexer and transmitting the modulated data field to a VSB reception system.

21 Claims, 6 Drawing Sheets

U.S. PATENT DOCUMENTS

| | | |
|---|---|---|
| 6,690,738 B1 | 2/2004 | Swenson et al. |
| 6,697,098 B1 | 2/2004 | Wang |
| 6,708,149 B1 | 3/2004 | Turin |
| 6,724,832 B1 | 4/2004 | Hershberger |
| 6,743,025 B1 | 6/2004 | Howard |
| 6,760,077 B1 * | 7/2004 | Choi et al. .................. 348/614 |
| 6,788,710 B1 | 9/2004 | Knutson et al. |
| 2002/0085632 A1 | 7/2002 | Choi et al. |
| 2004/0240590 A1 | 12/2004 | Cameron et al. |

FOREIGN PATENT DOCUMENTS

| | | |
|---|---|---|
| KR | 2000-00185531 | 4/1997 |

OTHER PUBLICATIONS

U.S. Appl. No. 60/198,014 to Wayne Breti, et al., filed on Apr. 18, 2000.

* cited by examiner

COMMUNICATION SYSTEM IN DIGITAL TELEVISION

CROSS REFERENCE TO RELATED ART

This application claims the benefit of Korean Patent Application No. 2001-22201, filed on Apr. 25, 2001, which is hereby incorporated by reference in its entirety.

BACKGROUND OF THE INVENTION

1. Field of the Invention

The present invention relates to a digital television transmission system, and more particularly, to a 8T-VSB (Vestigial Sideband) transmission system for transmitting supplemental data in addition to MPEG data and to a signal format for the VSB transmission system.

2. Description of the Related Art

The United States of America has employed ATSC 8T-VSB (8 Trellis-Vestigial Sideband) as a standard since 1995, and has been broadcasting in the ATSC 8T-VSB since the later half of 1998. South Korea also has employed the ATSC 8T-VSB as a standard. South Korea started test broadcasting in May 1995, and has since August 2000 put in place a regular test broadcasting system. The advancement of technology allows the transmission of digital television (DTV) in the same 6 MHz bandwidth currently used by NTSC.

FIG. 1 illustrates a block diagram of a related art ATSC 8T-VSB transmission system ("VSB transmission system"). The VSB transmission system 16 generally comprises a data randomizer 1, Reed-Solomon coder 2, data interleaver 3, Trellis coder 4, multiplexer 5, pilot inserter 6, VSB modulator 7 and RF converter 8.

Referring to FIG. 1, there is a data randomizer 1 for receiving and making random MPEG data (video, audio and ancillary data). The data randomizer 1 receives the MPEG-II data output from an MPEG-II encoder. Although not shown in FIG. 1, the MPEG-II encoder takes baseband digital video and performs bit rate compression using the techniques of discrete cosine transform, run length coding, and bi-directional motion prediction. The MPEG-II encoder then multiplexes this compressed data together with pre-coded audio and any ancillary data that will be transmitted. The result is a stream of compressed MPEG-II data packets with a data frequency of only 19.39 Mbit/Sec. The MPEG-II encoder outputs such data to the data randomizer in serial form. MPEG-II packets are 188 bytes in length with the first byte in each packet always being the sync or header byte. The MPEG-II sync byte is then discarded. The sync byte will ultimately be replaced by the ATSC segment sync in a later stage of processing.

In the VSB transmission system 16, the 8-VSB bit stream should have a random, noise-like signal. The reason being that the transmitted signal frequency response must have a flat noise-like spectrum in order to use the allotted 6 MHz channel space with maximum efficiency. Random data minimizes interference into analog NTSC. In the data randomizer 1, each byte value is changed according to known pattern of pseudo-random number generation. This process is reversed in the VSB receiver in order to recover the proper data values.

The Reed-Solomon coder 2 of the VSB transmission system 16 is used for subjecting the output data of the data randomizer 1 to Reed-Solomon coding and adding a 20 byte parity code to the output data. Reed Solomon encoding is a type of forward error correction scheme applied to the incoming data stream. Forward error correction is used to correct bit errors that occur during transmission due to signal fades, noise, etc. Various types of techniques may be used as the forwarding error correction process.

The Reed-Solomon coder 2 takes all 187 bytes of an incoming MPEG-II data packet (the sync or header byte has been removed from 188 bytes) and mathematically manipulates them as a block to create a digital sketch of the block contents. This "sketch" occupies 20 additional bytes which are added at the tail end of the original 187 byte packet. These 20 bytes are known as Reed-Solomon parity bytes. The 20 Reed-Solomon parity bytes for every data packet add redundancy for forward error correction of up to 10 bytes errors/packet. Since Reed-Solomon decoders correct byte errors, and bytes can have anywhere from 1 to 8 bit errors within them, a significant amount of error correction can be accomplished in the VSB receiver. The output of the Reed-Solomon coder 2 is 207 bytes (187 plus 20 parity bytes).

The VSB receiver will compare the received 187 bytes block to the 20 parity bytes in order to determine the validity of the recovered data. If errors are detected, the receiver can use the parity bytes to located the exact location of the errors, modify the corrupted bytes, and reconstruct the original information.

The data interleaver 3 interleaves the output data of the Reed-Solomon coder 2. In particular, the data interleaver 3 mixes the sequential order of the data packet and disperses or delays the MPEG-II packet throughout time. The data interleaver 3 then reassembles new data packets incorporating small sections from many different MPEG-II (pre-interleaved) packets. The reassembled packets are 207 bytes each.

The purpose of the data interleaver 3 is to prevent losing of one or more packets due to noise or other harmful transmission environment. By interleaving data into many different packets, even if one packet is completely lost, the original packet may be substantially recovered from information contained in other packets.

The VSB transmission system 16 also has a trellis coder 4 for converting the output data of the data interleaver 3 from byte form into symbol form and for subjecting it to trellis coding. Trellis coding is another form of forward error correction. Unlike Reed-Solomon coding, which treated the entire MPEG-II packet simultaneously as a block, trellis coding is an evolving code that tracks the progressing stream of bits as it develops through time.

The trellis coder 4 adds additional redundancy to the signal in the form of more (than four data levels, creating the multilevel (8) data symbols for transmission. For trellis coding, each 8-bit byte is split up into a stream of four, 2-bit words. In the trellis coder 4, each 2-bit input word is compared to the past history of previous 2-bit words. A 3-bit binary code is mathematically generated to describe the transition from the previous 2-bit word to the current one. These 3-bit codes are substituted for the original 2-bit words and transmitted as the eight level symbols of 8-VSB. For every two bits that enter the trellis coder 4, three bits come out.

The trellis decoder in the VSB receiver uses the received 3-bit transition codes to reconstruct the evolution of the data stream from one 2-bit word to the next. In this way, the trellis coder follows a "trail" as the signal moves from one word to the next through time. The power of trellis coding lies in its ability to track a signal's history through time and discard potentially faulty information (errors) based on a signal's past and future behavior.

A multiplexer 5 is used for multiplexing a symbol stream from the trellis coder 4 and synchronizing signals. The segment and the field synchronizing signals provide information to the VSB receiver to accurately locate and demodulate the transmitted RF signal. The segment and the field synchronizing signals are inserted after the randomization and error coding stages so as not to destroy the fixed time and amplitude relationships that these signals must posses to be effective. The multiplexer 5 provides the output from the trellis coder 4 and the segment and the field synchronizing signals in a time division manner.

An output packet of the data interleaver 3 comprises the 207 bytes of an interleaved data packet. After trellis coding, the 207 bytes segment is stretched out into a baseband stream of 828 eight level symbols. The segment synchronizing signal is a four symbol pulse that is added to the front of each data segment and replaces the missing first byte (packet sync byte) of the original MPEG-II data packet. The segment synchronizing signal appears once very 832 symbols and always takes the form of a positive-negative-positive pulse swinging between the +5 and −5 signal levels.

The field synchronizing signal is an entire data segment that is repeated once per field. The field synchronizing signal has a known data symbol pattern of positive-negative pulses and is used by the receiver to eliminate signal ghosts caused by poor reception.

The VSB transmission system 16 also has the pilot inserter 6 for inserting pilot signals into the symbol stream from the multiplexer 5. Similar to the synchronizing signals described above, the the pilot signal is inserted after the randomization and error coding stages so as not to destroy the fixed time and amplitude relationships that these signals must posses to be effective.

Before the data is modulated, a small DC shift is applied to the 8T-VSB baseband signal. This causes a small residual carrier to appear at the zero frequency point of the resulting modulated spectrum. This is the pilot signal provided by the pilot inserter 6. This gives the RF PLL circuits in the VSB receiver something to lock onto that is independent of the data being transmitted.

After the pilot signal has been inserted by the pilot inserter 6, the output is subjected to a VSB modulator 7. The VSB modulator 7 modulates the symbol steam from the pilot inserter 6 into a 8 VSB signal of an intermediate frequency band. The VSB modulator 7 provides a filtered (root-raised cosine) IF signal at a standard frequency (44 MHz in the U.S.), with most of one sideband removed.

In particular, the eight level baseband signal is amplitude modulated onto an intermediate frequency (IF) carrier. The modulation produces a double sideband IF spectrum about the carrier frequency. The total spectrum is too wide to be transmitted in the assigned 6 MHz channel.

The sidelobes produced by the modulation are simply scaled copies of the center spectrum, and the entire lower sideband is a mirror image of the upper sideband. Therefore using a filter, the VSB modulator discards the entire lower sideband and all of the sidelobes in the upper sideband. The remaining signal (upper half of the center spectrum) is further eliminated in one-half by using the Nyquist filter. The Nyquist filter is based on the Nyquist Theory, which summarizes that only a ½ bandwidth is required to transmit a digital signal at a given sampling rate.

Finally, there is a RF (Radio Frequency) converter 8 for converting the signal of an intermediate frequency band from the VSB modulator 7 into a signal of a RF band signal, and for transmitting the signal to a reception system through an antenna 9.

The foregoing VSB communication system is at least partially described in U.S. Pat. Nos. 5,636,251, 5,629,958 and 5,600,677 by Zenith Co. which are incorporated herein by reference. The 8T-VSB transmission system, which is employed as the standard digital TV broadcasting in North America and South Korea, was developed for the transmission of MPEG video and audio data. As technologies for processing digital signals develop and the use of the Internet increases, the trend currently is to integrate digitized home appliances, the personal computer, and the Internet into one comprehensive system.

Therefore, in order to satisfy the variety of the demands of users, there is a need to develop a communication system that facilitates the addition and transmittal of a variety of supplemental data to the video and audio data through the digital broadcasting channel. It is predicted that the use of supplemental data broadcasting may require PC (Personal Computer) cards or portable appliances, with simple indoor antennas.

However, there can be a substantial reduction of signal strength due to walls and nearby moving bodies. There also can be ghost and noise caused by reflective waves, which causes the performance of the signal of the supplemental data broadcasting to be substantially poor. Supplemental data broadcasting is different from general video and audio data in that it requires a lower error ratio in transmission. For general video and audio data, errors imperceptible to the human eye or ear are inconsequential. In contrast, for supplemental data, even one bit of error in the supplemental data (which may include program execution files, stock information, and other similar information) may cause a serious problem. Therefore, the development of a communication system that is more resistant to the ghost and noise occurring on the channel is absolutely required.

In general, the supplemental data is transmitted by a time division system on a channel similar to the MPEG video and audio data. After the incorporation of digital broadcasting, there has already been a widespread emergence in the home appliance market of receivers equipped to receive ATSC VSB digital broadcast signals. These products receive MPEG video and audio data only. Therefore, it is required that the transmission of supplemental data on the same channel as the MPEG video and audio data has no adverse influence on the existing receivers that are equipped to receive ATSC VSB digital broadcasting.

The above situation is defined s ATSC VSB backward compatibility, and the supplemental data broadcasting system must be a system that is backward-compatible with the ATSC VSB communication system.

SUMMARY OF THE INVENTION

Accordingly, the present invention is directed to a VSB communication system, and a signal format for the VSB communication system that substantially obviates one or more of the problems due to the limitations and disadvantages of the related art.

An object of the present invention is to provide an ATSC VSB transmission system, which can transmit the present MPEG video and audio data together with supplemental data.

Another object of the present invention is to provide an ATSC VSB transmission system that is more robust to ghost and noise.

A further object of the present invention is to provide a new ATSC VSB transmission system that is fully backward-compatible with a related art ATSC VSB transmission system.

A still further object of the present invention is to provide a transmission data format that is suitable to an ATSC VSB transmission system which is robust to ghost and noise.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the VSB transmitter for use with an MPEG data signal and a supplemental data signal comprises a VSB supplemental data processor and a 8T-VSB transmission system. The VSB supplemental data processor comprises a forward error correction coder that codes the supplemental data signal; a null sequence inserter for inserting a null sequence to the supplemental data signal subjected to the forward error correction coder for generating a predefined sequence; a header inserter for inserting a header to the supplemental data signal having the null sequence inserted therein; and a multiplexer for multiplexing the MPEG data signal and the supplemental data signal having the header inserted thereto in at least one of a predetermined multiplexing ratio and unit.

The VSB transmission system is responsive to the VSB supplemental data processor for modulating an output from the multiplexer to form at least one data field comprising a plurality of segments that includes at least one segment representing the supplemental data signal and at least one segment representing the MPEG data signal.

According to one aspect of the present invention, the forward error correction coder is a Reed-Solomon coder. The supplemental data signal includes at least one data packet having X bytes and the Reed-Solomon coder provides parity bytes of Y bytes, wherein a total of X and Y bytes is 184 bytes.

According to another aspect of the present invention, the header inserter adds three bytes of header information to the data packet. Preferably, the null sequence inserter divides the one data packet of the supplemental data signal into two data packets. The predefined sequence has substantially the same occurrence of bits "1" and "0".

According to another aspect of the present invention, the VSB transmitter further comprises an interleaver receiving data from the forward error correction coder and outputting to the null sequence inserter. The interleaver interleaves the supplemental data signal with forward error corrected code.

Another object of the present invention is to provide an input bit value so as to constantly maintain memory data of a trellis coder in 8T VSB transmitter.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings.

Figure 2:
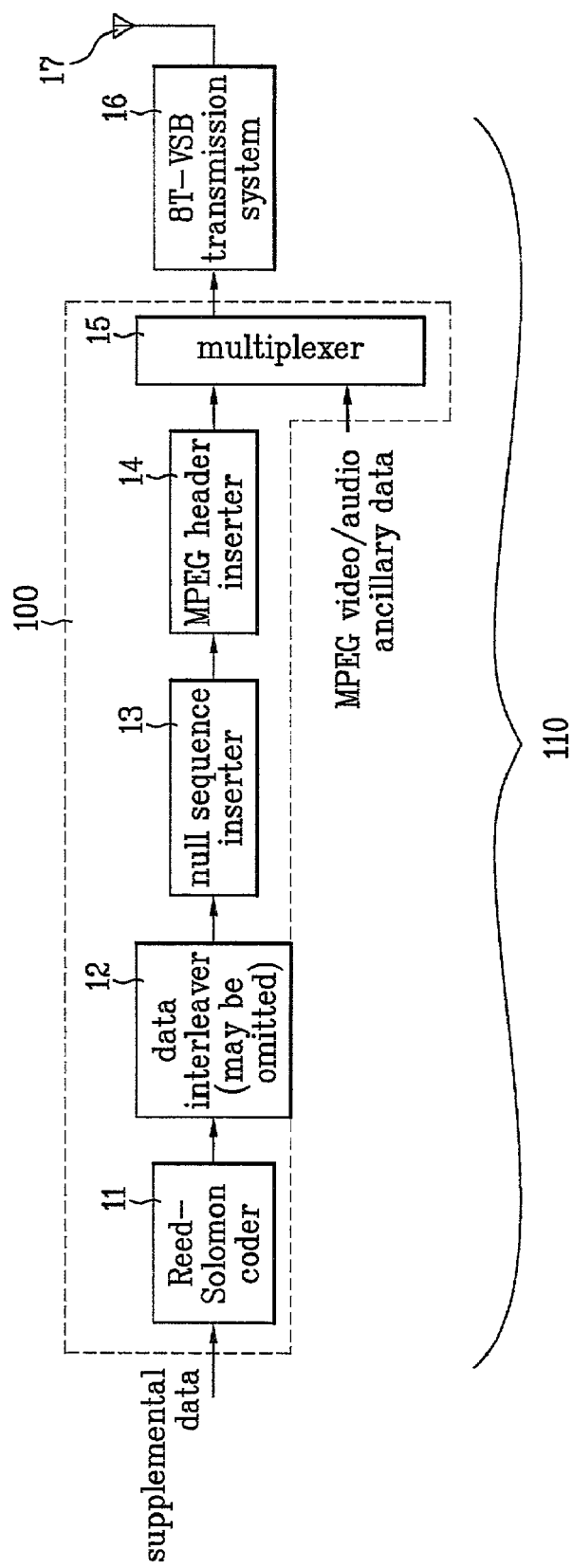
FIG. 2 illustrates a block diagram showing a VSB transmitter for transmitting supplemental and MPEG data in accordance with a preferred embodiment of the present invention.
Figure 3:
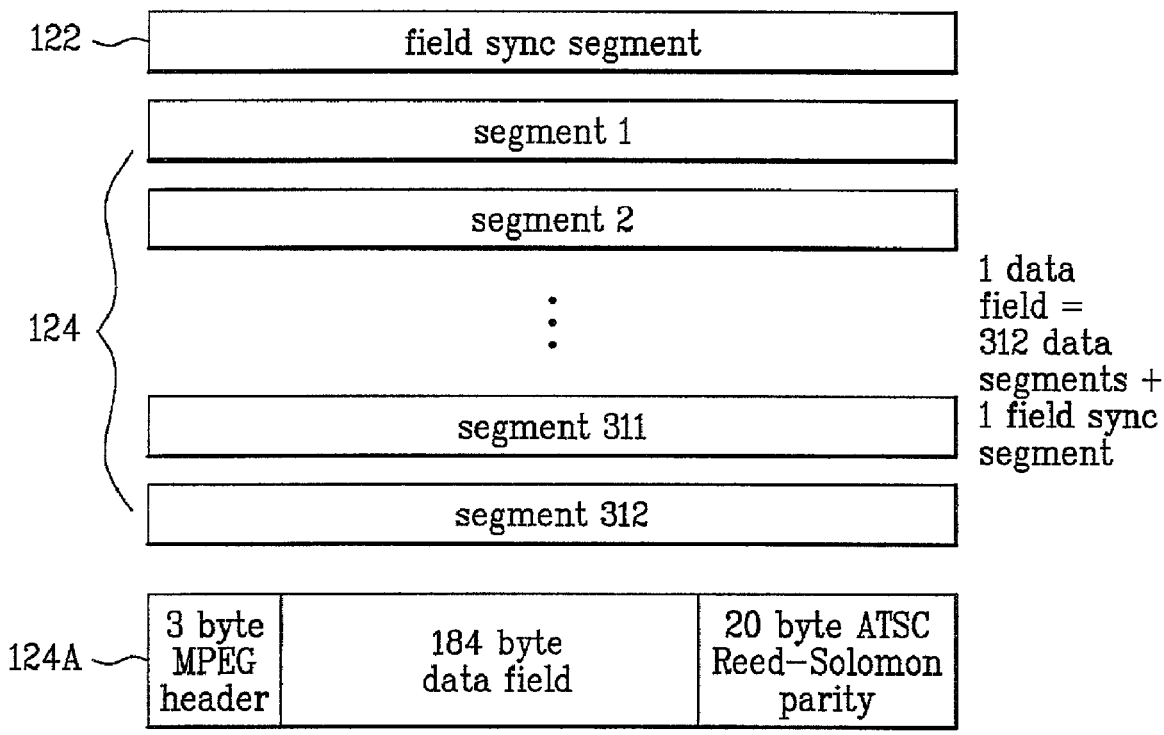
FIG. 3 illustrates the frame architecture of a transmission data for a VSB transmission system in accordance with a preferred embodiment of the present invention.
Figure 4:
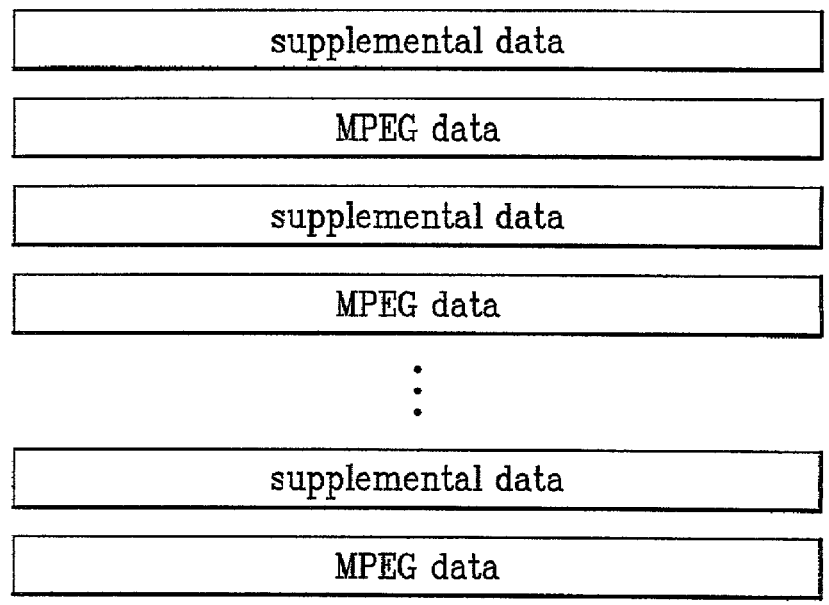
FIG. 4 illustrates a diagram showing a process for multiplexing supplemental data and MPEG data for forming a VSB data field.
Figure 5:
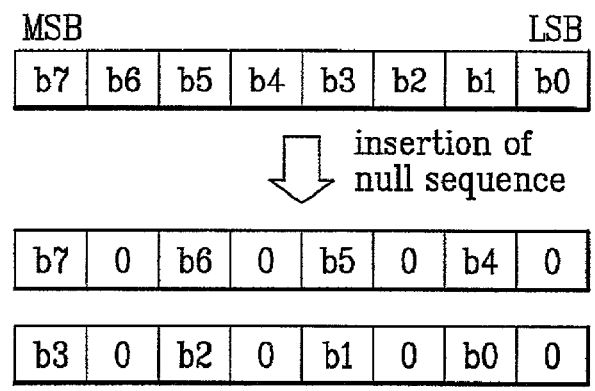
FIG. 5 illustrates an example of inserting the null sequence into the supplemental data by the null sequence inserter and generating a predefined sequence.
Figure 6:
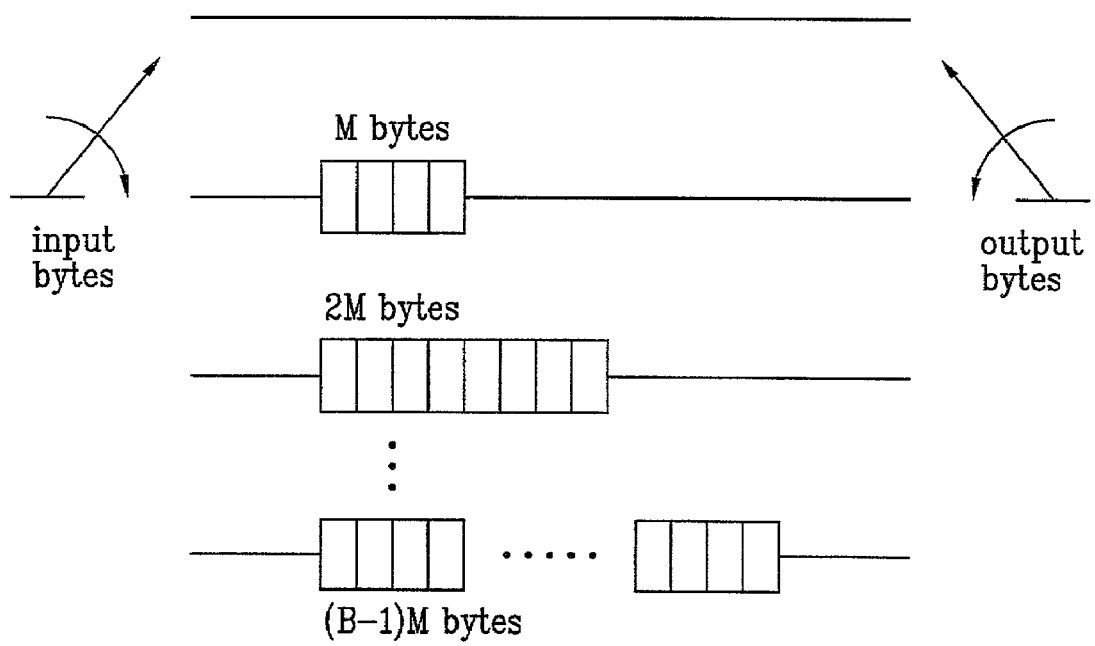
FIG. 6 illustrates a schematic diagram of a data interleaver for interleaving supplemental data.
Figure 7:
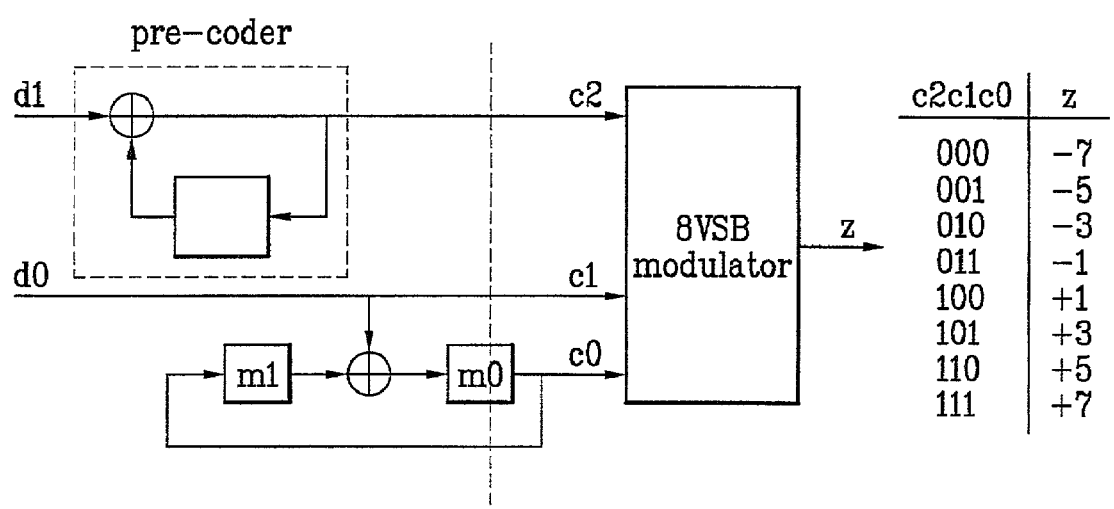
FIG. 7 illustrates block diagram of trellis coder and pre-coder.
Figure 8:
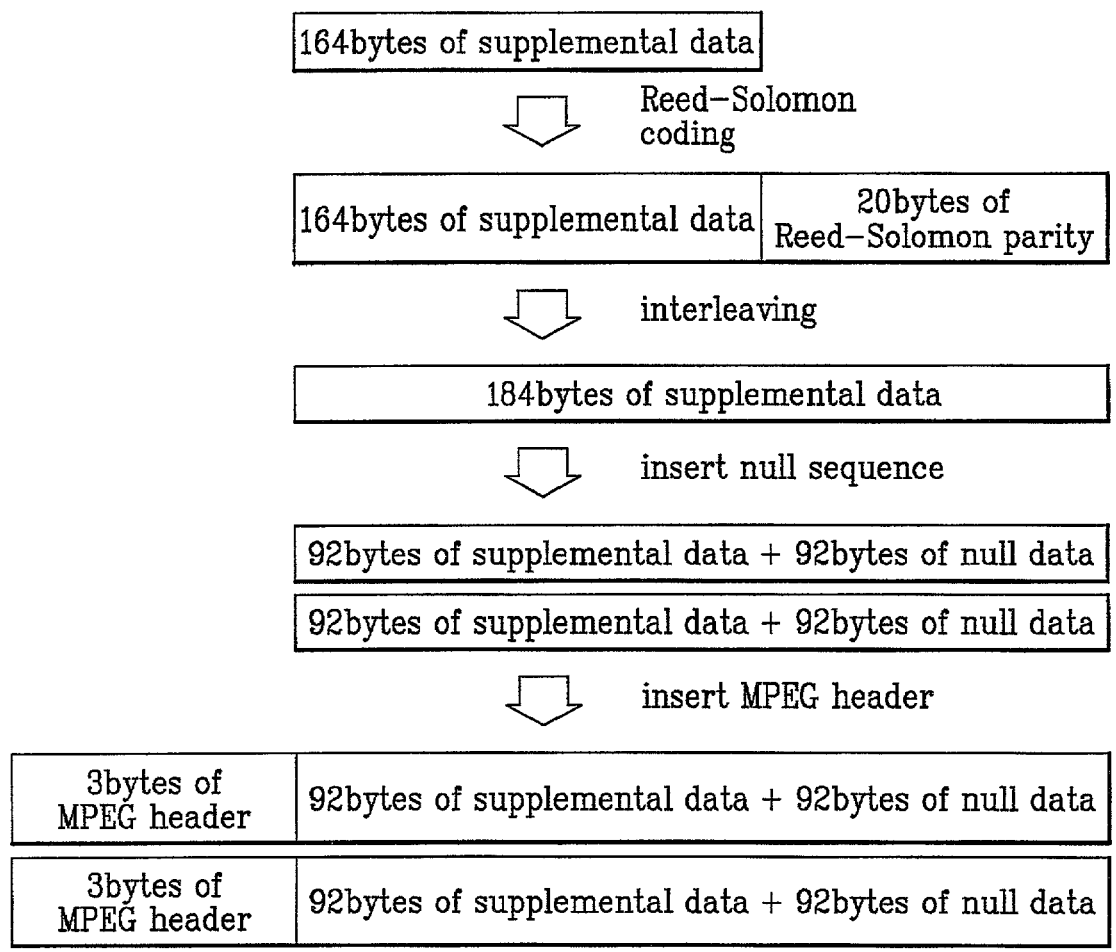
FIG. 8 illustrates an example of coding supplemental data.

FIG. 2 illustrates a block diagram showing a VSB transmitter 110 for the transmission of the supplemental and MPEG data in accordance with a preferred embodiment of the present invention. FIG. 3 illustrates the frame architecture of transmission data for a VSB transmission system in accordance with a preferred embodiment of the present invention. FIG. 4 illustrates a diagram showing a process for multiplexing supplemental data and MPEG data for forming a VSB data field. FIG. 5 illustrates a diagram showing a process for inserting a null sequence to generate a predefined sequence. FIG. 6 illustrates a diagram showing a data interleaver for interleaving supplemental data. FIG. 7 illustrates block diagram of trellis coder and pre-coder FIG. 8 illustrates a digram showing an example of coding supplemental data.

In FIG. 2, the VSB transmitter 110 in accordance with a preferred embodiment of the present invention includes a VSB supplemental data processor 100 and a VSB transmission system 16. The description of the VSB transmission system 16 is described above in connection with FIG. 1, and thus, will not be repeated. According to the preferred embodiment of the present invention, the VSB supplemental data processor includes a Reed-Solomon coder 11, a data interleaver 12, a null sequence inserter 13, an MPEG header inserter 14, a multiplexer 15, an 8T-VSB transmission system 16, and an antenna 17.

As shown in FIG. 2, for the transmission of the supplemental data from the VSB transmitter 110 (i.e., a broadcasting station) to a VSB reception system on a channel (terrestrial or cable), the VSB transmitter 110 subjects the supplemental data to various digital signal processes. To provide backward compatibility of the present invention with existing devices, the supplemental data is preferably 164 byte packet which will eventually be processed to be a 187 byte packet before entering the VSB transmission system 16. However, the size of the supplemental data packet may be varied so long as the output of the VSB supplemental data processor 100 is compatible with the VSB transmission system 16.

In the VSB supplemental data processor 100, there is provided a Reed-Solomon coder 11 for the correction of errors. The supplemental data is coded at a Reed-Solomon coder (or R-S coder) 11. Preferably, the Reed-Solomon coder 11 is used for subjecting the supplemental data to Reed-Solomon coding and adding a 20 byte parity code to the output data. As described above, Reed Solomon encoding is a type of forward error correction scheme applied to the incoming data stream. Forward error correction is sued to correct bit errors that occur during transmission due to signal fades, noise, etc. Various other types of error correction techniques known to one of ordinary skill in the art may be used as the forward error correction process.

According to the preferred embodiment, the Reed-Solomon coder 11 of the VSB supplemental data processor takes 164 bytes of an incoming supplemental data packet and mathematically manipulates them as a block to create a digital sketch of the block contents. The 20 additional bytes are added at the tail end of the original 164 bytes packet. These 20 bytes are known as Reed-Solomon parity bytes. Since Reed-Solomon decoders of the VSB reception system correct byte errors, and bytes can have anywhere from 1 to 8 bit errors within them, a significant amount of error correction can be accomplished in the VSB receiver. The output of the Reed-Solomon coder 11 is preferably 184 bytes (164 bytes from the original packet plus 20 parity bytes).

The VSB supplemental data processor 100 further includes the data interleaver 12, which interleaves the output data of the Reed-Solomon coder 11. The interleaver 12 is for interleaving the coded supplemental data to enhance performance against burst noise. The interleaver 12 may be omitted, if necessary.

The data interleaver 12 according to the preferred embodiment mixes the sequential order of the supplemental data packet and disperses or delays the supplemental data packet throughout time. The data interleaver 12 then reassembles new data packets incorporating small sections from many different supplemental data packets. Each one of the reassembled packets are 184 bytes long.

As described above, the purpose of the data interleaver 12 is to prevent losing of one or more packets due to noise or other harmful transmission environment. By interleaving data into many different packets, even if one packet is completely lost, the original packet may be recovered from information contained in other packets. However there is a data interleaver in the ATSC 8T-VSB transmission system, the data interleaver for the supplemental data can be omitted if is not required to enhance the burst noise performance of the supplemental data. For this reason, the data interleaver 12 may not be necessary for the VSB supplemental data processor 100.

Figure 1:
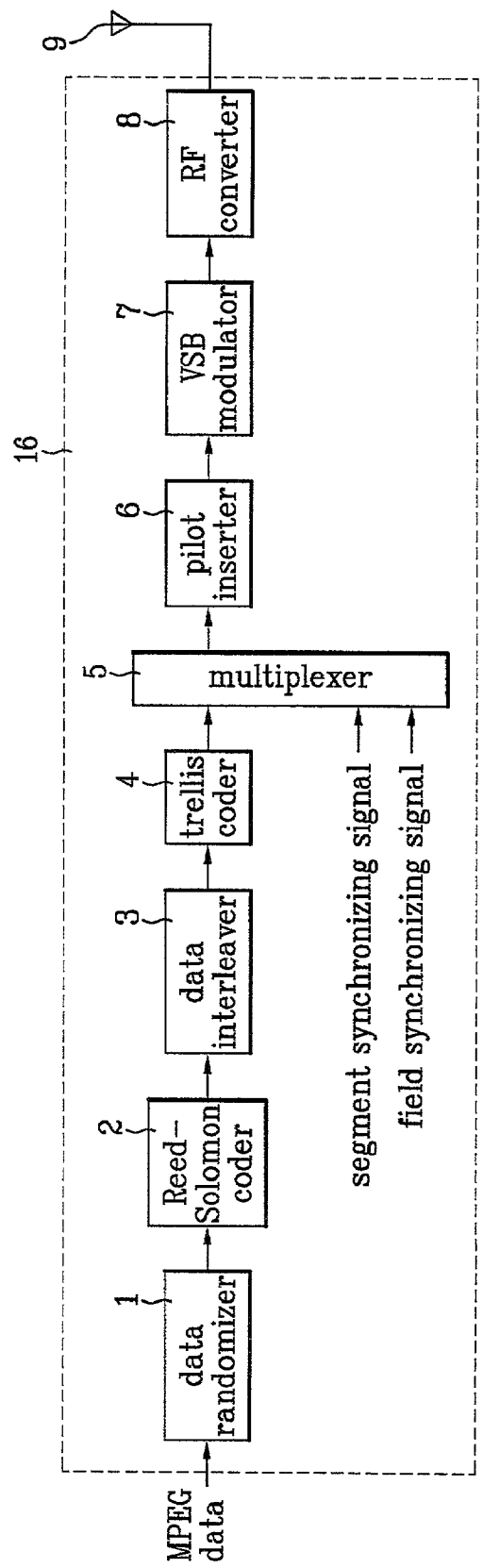
FIG. 1 illustrates a block diagram showing a conventional VSB transmission system.

The VSB supplemental data processor 100 also includes the null sequence inserter 13 for inserting a null sequence to an allocated region of the interleaved (if the data interleaver 12 was present) or Reed-Solomon coded supplemental data for generating the predefined sequence for the supplemental data at an input terminal of a Trellis coder (shown in FIG. 1). The null sequence is inserted so that the VSB reception system receives the supplemental data more reliably, even in a noisy multipath fading channel. An example structure of the transmission data formed by the insertion of the null sequence will be explained below in detail with reference to FIG. 5.

Further referring to FIG. 2, the VSB supplemental data processor 100 includes the MPEG header inserter 14 for adding an MPEG header to the supplemental data having the null sequence inserted thereto, for backward-compatibility with the legacy VSB reception system. Because the MPEG-II data supplied to the VSB transmission system 16 is 187 bytes long, the MPEG header inserter 14 places, preferably, three headers in front of each packet (which was 184 bytes) to form a 187 bytes long packet identical to the MPEG-II data packet.

The supplemental data having the MPEG header added thereto is provided to a multiplexer 15. The multiplexer 15 receives as inputs the processed supplemental data from the MPEG header inserter 14 and MPEG data packets. MPEG data packet, such as a broadcasting program (movie, sports, entertainment, or drama), coded through another path (output from MPEG encoder), is received together with the supplemental data at the multiplexer 15. Upon reception of the MPEG data and the supplemental data, the multiplexer 15 multiplexes the supplemental data and the MPEG data at a fixed ratio under the control of a controller defining a multiplexing ratio and unit and forwards the multiplexed data to the 8T-VSB transmission system 16.

The 8T-VSB transmission system 16, which is described in detail in reference to FIG. 1, processes the multiplexed data and transmits the processed data to the VSB reception system through the antenna 17.

For example, the Reed-Solomon coder 11 uses a code having a block size N=184, a payload K=164, and an error correction capability T=10. On the other hand, as a generator polynomial of the Galois Field and the Reed-Solomon coder 11, the same code as the the Reed-Solomon coder 2 described with respect to FIG. 1 may be used. According to the preferred embodiment, other values of the block size N, the payload K, and the error correction capability T may be used in the Reed-Solomon coder 11 in FIG. 2. For an example, a code having N=184, K=154, and T=15 may be used, or a code having N=92, K=82, and T=5 may be used. Although the Reed-Solomon code is used in the present invention, other code suitable for error correction known to one of ordinary skill in the art may be used therein.

FIG. 3 illustrates the structure of a VSB data field used in the VSB transmission system 100. As shown in FIG. 3, one data field has 313 segments: 312 data segments 124 and one field synchronizing segment 122. The 312 data segments have data segments of the supplemental data and the MPEG data segments. Each data segment 124A has 184 byte data, a 3 byte MPEG header, and the 20 byte ATSC Reed-Solomon parity. The 3 byte MPEG header will be used by the MPEG decoder in the VSB reception system.

The use of the MPEG header is explained in more detail. ISO/IEC 13818-1 has a definition on an MPEG transport packet header. If a 3×47 synchronization byte is removed from the MPEG transport packet header, a 3 byte header is left. A PID (program identification) is defined by this 3 bytes. A transport part of the MPEG decoder discards a packet if the PID of the received packet received is not valid. For example, a null packet PID or other reserved PID can be used. Therefore, the MPEG header inserter 14 in FIG. 2 inserts the 3 byte header containing such a PID into the supplemental data packet. Therefore, the supplemental data can be discarded at the MPEG decoder of the legacy VSB receiver.

FIG. 4 illustrates a process for multiplexing the supplemental data and the MPEG data at the multiplexer 15 in FIG. 2. As shown in FIG. 4, the supplemental data is multiplexed with the MPEG data in segment units. The supplemental data is multiplexed with the MPEG data in synchronous to the field synchronizing signal used for synchronizing a data frame synchronization in the VSB transmission system.

Therefore, the VSB reception system determines the multiplexing locations of the MPEG data and the supplemental data in the field data received synchronous to the field synchronizing signal. The VSB reception system demultiplexes the MPEG data and the supplemental data based on the multiplexing locations. A multiplexing ratio and method for multiplexing the MPEG data and the supplemental data may vary with amounts of data thereof.

Information on the variable multiplexing method and ratio may be loaded on, for example, a reserved area of the 92 bits not used in the field synchronizing signal. By retrieving and decoding such information, the VSB reception system identifies the correct multiplexing ratio and method from the multiplexing information contained in the field synchronizing signal.

Alternatively, the multiplexing information may be inserted, not only in the reserved area of the field synchronizing signal, but also in the data segment of the supplemental data. As shown in FIG. 4, of the entire 312 multiplexed data segments, one half are occupied by the data segments representing the supplemental data inputted to the VSB supplemental data processor 100. One of the supplement data segment may be used to transmit the multiplexing information for use by the VSB reception system.

FIG. 5 illustrates an example of inserting the null sequence into the supplemental data by the null sequence inserter 13 according to the preferred embodiment of the present invention. The supplemental data having the null sequence inserted therein is transmitted to the VSB reception system. The predefined sequence has 1's and 0's arranged in a fixed order. The predefined sequence inserted in the supplemental data can be used for performance improvement in the reception system.

For example, the channel equalizer of the VSB reception system uses the sequence to enhance ghost cancellation performance of both the supplemental data and the MPEG data and the Trellis decoder can use the sequence to improve noise performance of supplemental data. As shown in FIG. 5, upon reception of one supplemental data byte, the null sequence inserter 13 for generating the predefined sequence inserts null bits, to provide two bytes.

The inserted null sequence is processed in the VSB transmission system 16 in FIG. 2, and then transmitted to the VSB reception system. The null sequence is randomized by the data randomizer 1 of the VSB transmission system 16, and coded by the Reed-Solomon coder 2. Then, the null sequence is interleaved by the data interleaver 3, and provided to the Trellis coder 4 as an input signal D0. This converted sequence is the predefined sequence. The input signal D0 is a lower bit of the two input bits to the Trellis coder 4. The Trellis coder is basically operative such that three bits are provided with two received bits.

The VSB reception system generates the sequence received as the input signal D0 from the Trellis coder in the 8T-VSB transmission system 16, i.e., the predefined sequence, and uses the generated sequence for improving its own performance. Alternatively, other sequences known to one of ordinary skill in the art be used instead of the null sequence described above.

The VSB transmitter 110 of the present invention is required to have identical probabilities of occurrence of the 8 levels, for having backward-compatibility with the related art VSB transmission system. Therefore, the presence of the 0's and 1's in the sequence received as the input signal D0 at the Trellis coder are required to be almost the same.

FIG. 6 illustrates a block diagram of the data interleaver 12 for interleaving the supplemental data in FIG. 2. According to the preferred embodiment, a convolutional interleaver may be used as the data interleaver 12. However, other suitable interleaver, such as a block interleaver, known to one of ordinary skill in the art may also be used.

Referring to FIG. 6, the data interleaver 12 has 'B' (preferably 46) branches, and 'M' (preferably 4) bytes of unit memory. The data interleaver 12 may be operative synchronous to a field synchronization signal of the VSB transmission system 16. The 'B' branches, and the 'M' bytes of unit memory of the data interleaver 12 may be changed to other suitable value without deviating from the gist of the present invention.

Because the VSB transmission system 16 already includes a data interleaver 3, as shown in FIG. 1, the data interleaver 12 in the VSB supplemental data processor 1100 of FIG. 2 may be omitted if no further burst noise performance improvement is required.

FIG. 7 illustrates a construction diagram of a trellis coder. Memories m1 and m0 of the trellis coder can be maintained constantly by setting the first two d0 bits sequence among additional data bit sequences which are input consecutively after MPEG bit sequence in the trellis encoder (wherein, the setting means outputting of d0 in d0 bit generator so as to constantly maintain m0 and m1 for the first two symbols. After the outputting, data including nul sequence are used). For example, if the memory values 0 and 0 are wanted to be mainted, the first two bits sequences are set according to memories m1 and m0 of the coder prior to inputting of the additional data bit sequence, as follows.

| Memory (m0,m1) | first d0 | second d0 |
|---|---|---|
| (0,0) | 0 | 0 |
| (0,1) | 0 | 1 |
| (1,0) | 1 | 0 |
| (1,1) | 1 | 1 |

Once the memories of the trellis coder are set as a specific value by the first two d0 bit sequences, a performance of the receiver can be improved by using the set value. That is, since the memory value and the input bit sequence d0 are predicted from the third bit sequence among the additional bit sequence which is consecutively input after the MPEG bit sequence in a receiver, c1 and c0 are automatically set, thereby enabling to decode more precisely than to decode bits.

FIG. 8 illustrates a block diagram showing an example of supplemental data coding according to the preferred embodiment of the present invention. Referring to FIG. 8, the supplemental data has a block size of 164 bytes. FIG. 8 illustrates the process of coding the supplemental data packet until the supplemental data packet is provided to the multiplexer 15. This occurs after the supplemental data packet passes the Reed-Solomon coder 11, the data interleaver 12, the null sequence inserter 13, and the MPEG header inserter 14 in FIG. 2 in succession.

The operation of the VSB supplemental data processor 100 according to the present invention will be described. According to FIG. 8, a Reed-Solomon 20 byte parity is inserted to the supplemental data that is 164 bytes long by the Reed-Solomon coder 11. This process changes the supplemental data into a 184 byte packet. A number of parity bytes may vary with a number of the supplemental data bytes. For example, if the supplemental data has 154 bytes, the parity has 30 bytes. At the end, the number of the supplemental data bytes having the parity bytes added thereto is fixed to be 184 bytes in advance. The supplemental data having the parity added thereto is interleaved by the data interleaver 12 and provided to the null sequence inserter 13 92 bytes by 92 bytes. The null sequence insert 13 inserts 92 bytes of the null data into each of the 92 bytes of supplemental data to provide two 184 byte packets for the 184 bytes of supplemental data, where the 20 parity bytes are included in only one of the two 184 bytes packets.

Therefore, the MPEG header inserter 14 inserts 3 bytes of MPEG header, preferably containing the PID, to the front part of each of the supplemental data packets for backward-compatibility with the related art ATSC 8T-VSB transmission system. The multiplexer 15 multiplexes each of the supplemental data packets from the MPEG header inserter 14 and the MPEG data received through another route, and transmits the multiplexed data to the VSB transmission system 16. The VSB transmission system 16 codes the multiplexed data and transmits the data to the VSB reception system.

As FIG. 8, the MPEG header inserter 14 inserts 3 bytes of MPEG header to the front part of the 184 bytes of supplemental data packets for backward-compatibility with the related art ATSC 8T-VSB transmission system, for a total of 187 bytes of data. Finally, the multiplexer 15 multiplexer each of the supplemental data packets from the MPEG header inserter 14 and MPEG data received through another route, and transmits the multiplexed data to the VSB transmission system 16. The VSB transmission system 16 codes the multiplexed data, and transmits the data to the VSB reception system. At the end, FIG. 8 is identical in that the total number of bytes of the supplemental data having the null sequence inserted thereto is 184, and the total number of bytes of the supplemental data having the MPEG header added thereto is 187.

As has been explained, the present invention has the following advantages. First, supplemental data can be transmitted on the same channel with MPEG data with the supplemental data multiplexed with the MPEG data.

Second, a backward-compatibility with the conventional ATSC 8T VSB system can be sustained. That is, reception of the MPEG transport data at the ATSC 8T-VSB receiver is not affected. Third, reliable reception both of the MPEG data and the supplemental data at the reception system is facilitated by using the predefined sequence inserted in the supplemental data even on a channel with excessive ghost. Fourth, a noise immunity of the supplemental data is enhanced at the VSB reception system by using the predefined sequence inserted in the supplemental data. Fifth, transmission of other MPEG data through supplemental data path is permitted, which in turn permits reception of the MPEG data even in a poor channel state.

It will be apparent to those skilled in the art that various modifications and variations can be made in the VSB communication system, and the signal format for the VSB communication system of the present invention without departing from the spirit or scope of the invention. Thus, it is intended that the present invention cover the modifications and variations of this invention provided they come within the scope of the appended claims and their equivalents.

What is claimed is:

1. A VSB transmitter for use with an MPEG data signal and a supplemental data signal, the VSB transmitter comprising:
   a VSB supplemental data processor configured to preprocess the supplemental data signal, the VSB supplmental data processor comprising:
     a first forward error correction coder that codes the supplemental data signal;
     a data expander for expanding the coded supplemental data signal by inserting null bits into the supplemental data signal;
     a header inserter for inserting a header to the supplemental data signal having the null bits inserted therein; and
     a first multiplexer for multiplexing the MPEG data signal and the supplemental data signal having the header inserted thereto in at least one of a predetermined multiplexing ratio and unit; and
   a VSB main data processor configured to process the multiplexed data signal, the VSB main data processor comprising:
     a second forward error correction coder for coding the multiplexed data signal; and
     a data format converter for formatting the coded multiplexed data signal for transmission and for transmitting the formatted signal to one or more VSB receivers.

2. The VSB transmitter of claim 1, wherein the first forward error correction coder is a Reed-Solomon coder.

3. The VSB transmitter of claim 2, wherein the supplemental data signal includes at least one data having X bytes and the Reed-Solomon coder provides parity bytes of Y bytes, wherein a total of X and Y bytes is 184 bytes.

4. The VSB transmitter of claim 3, wherein the header inserter adds three bytes of header information to the data packet, wherein the header information contains program identification.

5. The VSB transmitter of claim 3, wherein the data expander divides the one data packet of the supplemental data signal into a plurality of data packets.

6. The VSB transmitter of claim 1, wherein the VSB supplemental data processor further comprises a data interleaver configured to interleave the supplemental data signal coded by the first forward error correction coder, and to output the interleaved data signal to the data expander.

7. The VSB transmitter of claim 6, wherein the first forward error correction coder is a Reed-Solomon coder.

8. The VSB transmitter of claim 7, wherein the supplemental data signal includes at least one data packet having X bytes and the Reed-Solomon coder provides parity bytes of Y bytes, wherein a total of X and Y bytes is 184 bytes.

9. The VSB transmitter of claim 8, wherein the header inserter adds three bytes of header information to the data packet, wherein the header information contains program identification.

10. The VSB transmitter of claim 8, wherein the data expander divides the one data packet of the supplemental data signal into a plurality of data packets.

11. The VSB transmitter of claim 1, wherein the multiplexing unit is a segment, and the multiplexing ratio varies with amounts of MPEG data packets representing the MPEG data signal and supplemental data packets representing the supplemental data signal.

12. The VSB transmitter of claim 11, wherein the multiplexing ratio of the supplemental data packets and the MPEG data packets in the first multiplexer is one segment to one segment.

13. The VSB transmitter of claim 11, wherein the multiplexing ratio of the supplemental data packets and the MPEG data packets in the first multiplexer is one segment to three segments.

14. The VSB transmitter of claim 1, wherein the first multiplexer is responsive to a field synchronizing signal used for synchronizing a data frame of the VSB transmission system.

15. A method for a supplemental data packet and an MPEG data packet in a VSB transmitter comprising a VSB supplemental data processor and a VSB main data processor, the method comprising the steps of:
    Reed-Solomon coding the supplement data packet for first error correction and adding a Reed-Solomon parity data of preset bytes to the coded supplemental data packet;
    interleaving the coded supplemental data packet;
    inserting null data into the interleaved supplemental data packet for producing at least one supplemental data packet of a preset number of bytes;
    adding an MPEG header of preset bytes to each one of the supplemental data packets;
    multiplexing the MPEG data packet with the header-added supplemental data packet at a preset multiplexing ratio;
    Reed-Solomon coding the multiplexed data at the preset multiplexing ratio for second forward error correction; and
    formatting the coded multiplexed data for transmission and transmitting the formatted data to one or more VSB receivers.

16. The method claim 15, wherein the Reed-Solomon parity is included to only one of the supplemental data packets.

17. The method of claim 15, wherein the inserting null data includes the steps of;
    dividing the supplemental data packet into two supplemental data packets having the same numbers of bytes; and
    inserting null data having the same bytes with the supplemental data packet into each one of the supplemental data packets to provide two supplemental data packets each having the null data inserter therein.

18. The method of claim 17, wherein each one of the supplemental data packets has 184 bytes comprising 92 bytes of supplemental data 92 bytes of the null data.

19. The method of claim 15, wherein the MPEG header is an identification code for identifying whether the multiplexed data is the supplemental data packet or the MPEG data packet.

20. The VSB transmitter of claim 1, wherein the VSB main data processor further comprises:
    a data randomizer for randomizing the multiplexed data signal;
    a data interleaver for interleaving the coded multiplexed data signal; and
    a Trellis coder for converting the interleaved data into symbols.

21. The VSB transmitter of claim 1, wherein the data format converter comprises:
    a second multiplexer for multiplexing the data signal coded by the second forward error correction coder with a field synchronizing signal and segment synchronizing signals;
    a pilot inserter for inserting pilot signals into the multiplexed symbol data;
    a modulator for modulating the symbol data having the pilot signals into an intermediate frequency signal; and
    a RF converter for converting the modulated signal into a RF signal for transmission.

* * * * *